United States Patent
Ogawa et al.

(10) Patent No.: US 6,753,642 B2
(45) Date of Patent: Jun. 22, 2004

(54) PIEZOELECTRIC CERAMIC AND PIEZOELECTRIC CERAMIC ELEMENT INCLUDING THE SAME

(75) Inventors: Hirozumi Ogawa, Shiga-ken (JP); Masahiko Kimura, Kusatsu (JP); Akira Ando, Omihachiman (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 10/130,675
(22) PCT Filed: Sep. 14, 2001
(86) PCT No.: PCT/JP01/07993
   § 371 (c)(1),
   (2), (4) Date: May 22, 2002
(87) PCT Pub. No.: WO02/24602
   PCT Pub. Date: Mar. 28, 2002

(65) Prior Publication Data
   US 2003/0001460 A1 Jan. 2, 2003

(30) Foreign Application Priority Data
Sep. 22, 2000 (JP) .......................... 2000-288101

(51) Int. Cl.$^7$ ............................................. H01L 41/187
(52) U.S. Cl. ................................... 310/358; 252/62.9 R
(58) Field of Search ....................... 310/358; 252/62.9 R

(56) References Cited

U.S. PATENT DOCUMENTS

| | | | | |
|---|---|---|---|---|
| 4,388,416 A | * | 6/1983 | Sakabe et al. | 501/136 |
| 4,601,841 A | * | 7/1986 | Yasuda et al. | 252/62.9 R |
| 4,900,702 A | * | 2/1990 | Tsuboi et al. | 501/134 |
| 5,449,652 A | * | 9/1995 | Swartz et al. | 501/134 |
| 5,479,140 A | * | 12/1995 | Abe et al. | 333/202 |
| 6,197,600 B1 | * | 3/2001 | Kijima et al. | 438/3 |
| 6,231,779 B1 | * | 5/2001 | Chiang et al. | 252/62.9 R |
| 6,426,018 B1 | * | 7/2002 | Takahashi et al. | 252/62.9 R |
| 6,461,532 B1 | * | 10/2002 | Oka et al. | 252/62.9 R |
| 2001/0015420 A1 | * | 8/2001 | Hirose et al. | 252/62.9 R |
| 2002/0035027 A1 | * | 3/2002 | Nanao et al. | 501/134 |
| 2002/0036282 A1 | * | 3/2002 | Chiang et al. | 252/62.9 R |

FOREIGN PATENT DOCUMENTS

| | | | | |
|---|---|---|---|---|
| JP | 3-201503 | * | 9/1991 | C04B/35/46 |
| JP | 11-21166 | * | 1/1999 | C04B/35/46 |
| JP | 11-74144 | * | 3/1999 | H01G/4/12 |

* cited by examiner

Primary Examiner—Thomas M. Dougherty
(74) Attorney, Agent, or Firm—Dickstein, Shapiro, Morin & Oshinsky, LLP

(57) ABSTRACT

In a piezoelectric ceramic containing a bismuth layer compound containing Ca, Bi, Ti, and O, as a main component, the molar ratio of Ca to Bi to Ti in the bismuth layer compound, which is the main component, is represented by a:b:c and formulas $0.15 \leq a/c < 0.25$ and $3.5 \leq (2a+3b)/c \leq 3.88$ are satisfied.

18 Claims, 2 Drawing Sheets

US 6,753,642 B2

PIEZOELECTRIC CERAMIC AND PIEZOELECTRIC CERAMIC ELEMENT INCLUDING THE SAME

TECHNICAL FIELD

The present invention relates to piezoelectric ceramics and piezoelectric ceramic elements including the same. The present invention particularly relates to a piezoelectric ceramic adapted to a material for piezoelectric ceramic elements such as piezoelectric ceramic filters, piezoelectric ceramic resonators, and piezoelectric ceramic oscillators, and to a piezoelectric ceramic element including the piezoelectric ceramic.

BACKGROUND ART

Hitherto, piezoelectric ceramics containing lead zirconate titanate ($Pb(Ti_xZr_{1-x})O_3$) or lead titanate ($PbTiO_3$) as a main component have been widely used for piezoelectric ceramic elements such as piezoelectric ceramic filters, piezoelectric ceramic resonators, and piezoelectric ceramic oscillators. Since piezoelectric ceramics containing lead zirconate titanate or lead titanate as a main component contain a large amount of lead, there is a problem in that the uniformity of product deteriorates because of the vaporization of lead oxide in the manufacturing process. In order to prevent the above problem, piezoelectric ceramics containing no lead or a small amount of lead are required. In view of environmental issues, piezoelectric ceramics containing less lead are preferable.

Since piezoelectric ceramics containing a bismuth layer compound such as $CaBi_4Ti_4O_{15}$ as a main component contain no lead oxides, the piezoelectric ceramics receive attention as materials for solving the above problem.

When a piezoelectric ceramic containing a bismuth layer compound such as $GaBi_4Ti_4O_{15}$ as a main component is used for a piezoelectric ceramic resonator, there is a problem in that the maximum value $Q_{max}$ of the electrical quality factor Q ($1/\tan \delta$) in a frequency band, that is, at a frequency between the resonance frequency and the antiresonant frequency, is not sufficiently large for practical use.

DISCLOSURE OF INVENTION

It is an object of the present invention to provide a piezoelectric ceramic that contains a bismuth layer compound such as $CaBi_4Ti_4O_{15}$ as a main component and no lead compounds or a small amount of lead, and is used for piezoelectric ceramic elements having a $Q_{max}$ with a practicable value, and to provide a piezoelectric ceramic element including the piezoelectric ceramic.

The present invention provides a piezoelectric ceramic including a bismuth layer compound containing Ca, Bi, Ti, and O, as a main component, wherein the molar ratio of Ca to Bi to Ti in the bismuth layer compound, which is the main component, is represented by a:b:c and formulas $0.15 \leq a/c < 0.25$ and $3.5 \leq (2a+3b)/c \leq 3.88$ are satisfied.

The piezoelectric ceramic according to the present invention may contain a bivalent metal element except Ca or a trivalent metal element except Bi, wherein the molar ratio of the metal element to Ti in the main component is 0.1 or less (but more than 0) to 1. In this case, the bivalent metal element except Ca contained in the piezoelectric ceramic is at least one selected from the group consisting of Mg, Sr, Ba, and Pb. In this case, the trivalent metal element except Bi contained in the piezoelectric ceramic is at least one selected from the group consisting of Sc, Y, La, Ce, Pr, Nd, Sm, Gd, Dy, Er, and Yb.

The piezoelectric ceramic according to the present invention further contains Zr, wherein the molar ratio of Zr to Ti in the main component is less than 0.25 (but more than 0) to 1.

The piezoelectric ceramic according to the present invention further contains 1.5% or less (but more than 0) by weight of Mn on a $MnCO_3$ basis.

The present invention provides a piezoelectric ceramic element having a piezoelectric ceramic including the piezoelectric ceramic according to the present invention and an electrode provided to the piezoelectric ceramic.

In the piezoelectric ceramic containing a bismuth layer compound containing Ca, Bi, Ti, and O, as a main component, the molar ratio of Ca to Bi to Ti in the bismuth layer compound, which is the main component, is represented by a:b:c and formulas $0.15 \leq a/c < 0.25$ and $3.5 \leq (2a+3b)/c \leq 3.88$ are satisfied. The reason for limiting the conditions to the above ranges is to obtain a practicable $Q_{max}$.

When the piezoelectric ceramic according to the present invention contains the bivalent metal element except Ca or the trivalent metal element except Bi, wherein the molar ratio of the metal element to Ti in the main component is 0.1 or less (but more than 0) to 1, the effects of the present invention are remarkable. The reason for limiting the molar ratio of the bivalent metal element except Ca or the molar ratio of the trivalent metal element except Bi to Ti in the main component to the ratio 0.1 or less (but more than 0) to 1 is as follows: when the ratio of the metal element to Ti exceeds the above value, the $Q_{max}$ is smaller than that of a piezoelectric ceramic not containing the metal element; hence, it is unnecessary to have the metal element.

When the piezoelectric ceramic according to the present invention contains Zr, wherein the molar ratio of Zr to Ti in the main component is 0.25 or less (but more than 0) to 1, the effects of the present invention are remarkable. The reason for limiting the molar ratio of Zr to Ti to the ratio of 0.25 or less (but more than 0) to 1 is as follows: when the ratio of Zr to Ti exceeds the above value, the $Q_{max}$ is smaller than that of the piezoelectric ceramic not containing Zr metal element; hence, it is unnecessary to have Zr.

When the piezoelectric ceramic according to the present invention contains 1.5% or less (but more than 0) by weight of Mn on a $MnCO_3$ basis, the effects of the present invention are remarkable. The reason for limiting the content of Mn to 1.5% or less (but more than 0) by weight of Mn on a $MnCO_3$ basis is as follows: when the Mn content exceeds the above value, the $Q_{max}$ is smaller than that of the piezoelectric ceramic not containing Zr metal element; hence, it is unnecessary to have Mn.

BEST MODE FOR CARRYING OUT THE INVENTION

Example $SrCO_3$, $Bi_2O_3$, $CaCO_3$, $BaCO_3$, $Nd_2O_3$, $La_2O_3$, $TiO_2$, $ZrO_2$, and $MnCO_3$ were used as starting materials, and weighed to satisfy the following formula: $Ca_aBi_bTi_cO_{15}+$ xMe+yZr+z MnCO$_3$, wherein Me represents Sr, Ba, Nd, and La, and a, b, c, x, y, and z are shown in Tables 1 and 2. The weighed starting materials were mixed by wet-mixing with a ball mill for 16 hours to obtain a mixture. The resulting mixtures were dried and calcined at 700–900° C. to obtain calcines.

Figure 1:
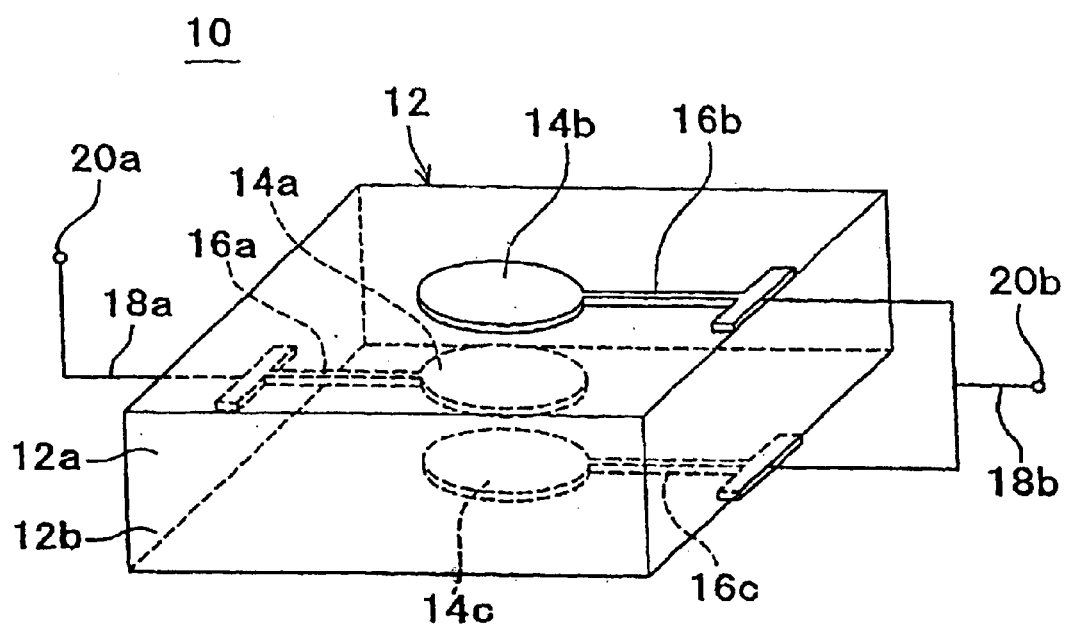
FIG. 1 is a plan view showing an exemplary piezoelectric ceramic resonator according to the present invention.
Figure 2:
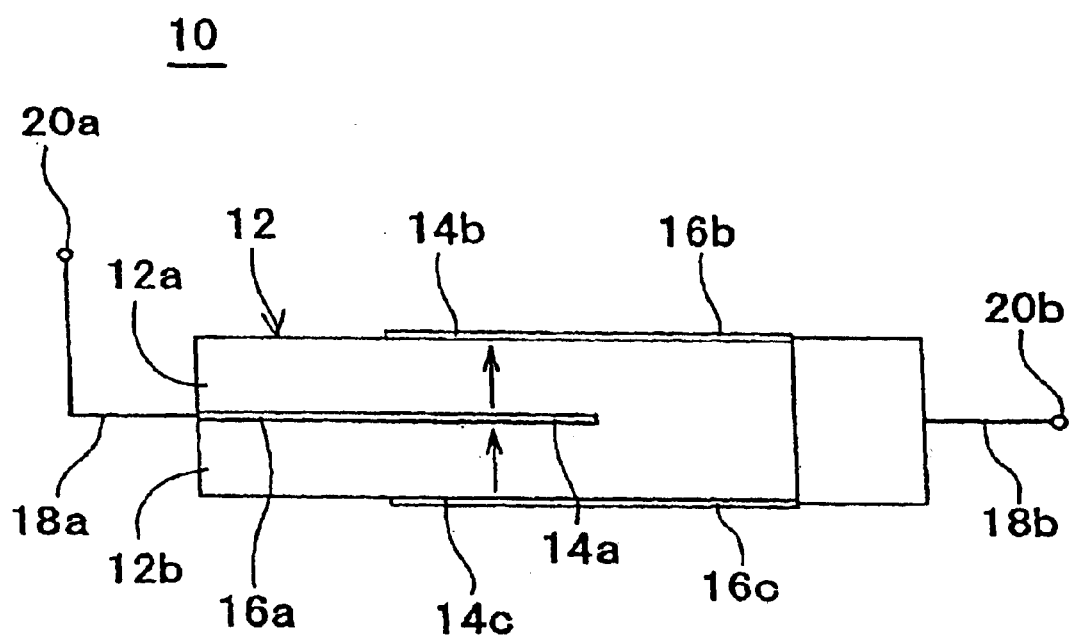
FIG. 2 is a sectional view showing the piezoelectric ceramic resonator shown in FIG. 1.

The calcines were roughly ground and then wet-ground with a ball mill for 16 hours by adding a proper amount of an organic binder to form sheets having a thickness of 40–80 μm, by a doctor blade method. An electrode was printed on some of the sheets by using a platinum paste. An electrode-printed sheet and an untreated sheet were laminated, the laminate was fired at 950–1170° C., the fired laminate was polarized with a direct voltage of 8–10 kV/mm for 10–30 minutes in an insulating oil at 100–200° C., and an energy-confining piezoelectric ceramic resonator (sample) was then completed as shown in FIGS. 1 and 2. As indicated by the arrow shown in FIG. 2, the direction of the polarization is perpendicular to the electrode.

As shown in FIGS. 1 and 2, a piezoelectric ceramic resonator 10 includes a piezoelectric ceramic 12 having, for example, a rectangular parallelepiped shape. The piezoelectric ceramic 12 has two piezoelectric ceramic layers 12a and 12b. The piezoelectric ceramic layers 12a and 12b comprise the piezoelectric ceramic having the above-mentioned formula, and are laminated. As indicated by the arrows shown in FIG. 2, the piezoelectric ceramic layers 12a and 12b are polarized in the same thickness direction.

An vibrating electrode 14a having, for example, a circular shape, is disposed between the piezoelectric ceramic layers 12a and 12b, and an extending electrode 16a having, for example, a T shape, extends from the vibrating electrode 14a to one end surface of the piezoelectric ceramic element 12. Another vibrating electrode 14b having, for example, a circular shape, is disposed in the center of the surface of the piezoelectric ceramic element 12a, and another extending electrode 16b having, for example, a T shape, extends from the vibrating electrode 14b to the other end surface of the piezoelectric ceramic element 12. Another vibrating electrode 14c having, for example, a circular shape, is disposed at the center of the surface of the piezoelectric ceramic element 12b, and another extending electrode 16c having, for example, a T shape, extends from the vibrating electrode 14c to the other end surface of the piezoelectric ceramic element 12. When viewed from above, the vibrating electrodes 14a, 14b, and 14c are aligned, and the vibrating electrode 14a is positioned between the vibrating electrodes 14b and 14c.

The extending electrode 16a is connected to one external terminal 20a with a lead wire 18a, and the other extending electrodes 16b and 16c are connected to the other external terminal 20b with another lead wire 18b.

In the piezoelectric ceramic resonator 10, when a voltage is applied to the external terminals 20a and 20b, a potential difference develops between the vibrating electrodes 14a and 14b and between the vibrating electrodes 14a and 14c to excite the secondary high frequency in a thickness longitudinal vibration mode.

For obtained Samples, the secondary high frequency in a thickness longitudinal vibration mode was measured to obtain the Q$_{max}$. Tables 1 and 2 show the results.

TABLE 1

| Samples | a | b | c | Me | x | y | z | Firing temp. (° C.) | Q$_{max}$ |
|---|---|---|---|---|---|---|---|---|---|
| 1* | 1.0 | 4.0 | 4.0 | — | 0 | 0 | 0 | 1,170 | 10.1 |
| 2* | 1.0 | 4.2 | 4.0 | — | 0 | 0 | 0 | 1,100 | 14.4 |
| 3* | 0.9 | 4.0 | 4.0 | — | 0 | 0 | 0 | 1,170 | 9.8 |
| 4 | 0.9 | 4.1 | 4.0 | — | 0 | 0 | 0 | 1,120 | 23.9 |
| 5 | 0.9 | 4.4 | 4.0 | — | 0 | 0 | 0 | 1,100 | 21.8 |
| 6* | 0.9 | 4.6 | 4.0 | — | 0 | 0 | 0 | 950 | 7.8 |
| 7* | 0.8 | 4.0 | 4.0 | — | 0 | 0 | 0 | 1,170 | 9.5 |
| 8 | 0.8 | 4.2 | 4.0 | — | 0 | 0 | 0 | 1,120 | 22.1 |
| 9 | 0.8 | 4.5 | 4.0 | — | 0 | 0 | 0 | 1,100 | 21.6 |
| 10* | 0.8 | 4.7 | 4.0 | — | 0 | 0 | 0 | 950 | 5.3 |
| 11* | 0.7 | 4.1 | 4.0 | — | 0 | 0 | 0 | 1,150 | 8.4 |
| 12 | 0.7 | 4.2 | 4.0 | — | 0 | 0 | 0 | 1,120 | 21.6 |
| 13 | 0.7 | 4.7 | 4.0 | — | 0 | 0 | 0 | 1,100 | 20.5 |
| 14* | 0.7 | 4.8 | 4.0 | — | 0 | 0 | 0 | 950 | 3.2 |
| 15* | 0.6 | 4.2 | 4.0 | — | 0 | 0 | 0 | 1,150 | 9.3 |
| 16 | 0.6 | 4.3 | 4.0 | — | 0 | 0 | 0 | 1,120 | 18.8 |
| 17 | 0.6 | 4.7 | 4.0 | — | 0 | 0 | 0 | 1,100 | 16.3 |
| 18* | 0.6 | 4.8 | 4.0 | — | 0 | 0 | 0 | 950 | 3.5 |
| 19* | 0.5 | 4.4 | 4.0 | — | 0 | 0 | 0 | 1,150 | 11.1 |
| 20* | 0.5 | 4.6 | 4.0 | — | 0 | 0 | 0 | 1,100 | 8.5 |
| 21 | 0.9 | 4.1 | 4.0 | — | 0 | 0 | 0.5 | 1,120 | 30.1 |
| 22 | 0.9 | 4.4 | 4.0 | — | 0 | 0 | 0.5 | 1,100 | 23.4 |
| 23 | 0.9 | 4.1 | 4.0 | — | 0 | 0 | 1.5 | 1,120 | 26.3 |
| 24 | 0.9 | 4.4 | 4.0 | — | 0 | 0 | 1.5 | 1,100 | 22.5 |
| 25 | 0.9 | 4.1 | 4.0 | — | 0 | 0 | 1.6 | 1,120 | 17.4 |
| 26 | 0.9 | 4.4 | 4.0 | — | 0 | 0 | 1.6 | 1,100 | 16.2 |
| 27 | 0.9 | 4.1 | 4.0 | Nd | 0.1 | 0 | 0 | 1,120 | 27.3 |
| 28 | 0.9 | 4.1 | 4.0 | Nd | 0.4 | 0 | 0 | 1,120 | 25.7 |
| 29 | 0.9 | 4.1 | 4.0 | Nd | 0.5 | 0 | 0 | 1,120 | 16.1 |
| 30 | 0.9 | 4.1 | 4.0 | Ba | 0.1 | 0 | 0 | 1,120 | 25.2 |

TABLE 2

| Samples | a | b | c | Me | x | y | z | Firing temp. (° C.) | Q$_{max}$ |
|---|---|---|---|---|---|---|---|---|---|
| 31 | 0.9 | 4.1 | 4.0 | Ba | 0.4 | 0 | 0 | 1,120 | 24.6 |
| 32 | 0.9 | 4.1 | 4.0 | Ba | 0.5 | 0 | 0 | 1,120 | 15.8 |
| 33 | 0.9 | 4.1 | 4.0 | Sr | 0.1 | 0 | 0 | 1,120 | 26.1 |
| 34 | 0.9 | 4.1 | 4.0 | Sr | 0.4 | 0 | 0 | 1,120 | 24.3 |
| 35 | 0.9 | 4.1 | 4.0 | Sr | 0.5 | 0 | 0 | 1,120 | 15.3 |
| 36 | 0.9 | 4.1 | 4.0 | La | 0.1 | 0 | 0 | 1,120 | 26.7 |
| 37 | 0.9 | 4.1 | 4.0 | La | 0.4 | 0 | 0 | 1,120 | 24.6 |
| 38 | 0.9 | 4.1 | 4.0 | La | 0.5 | 0 | 0 | 1,120 | 15.3 |
| 39 | 0.9 | 4.1 | 4.0 | — | 0 | 0.1 | 0 | 1,120 | 27.9 |
| 40 | 0.9 | 4.1 | 4.0 | — | 0 | 0.2 | 0 | 1,120 | 26.2 |
| 41 | 0.9 | 4.1 | 4.0 | — | 0 | 0.9 | 0 | 1,120 | 25.0 |
| 42 | 0.9 | 4.1 | 4.0 | — | 0 | 1 | 0 | 1,120 | 15.2 |

Samples with an asterisked number are outside the scope present invention.

Among prepared ceramics having the same composition, a ceramic having the largest Q$_{max}$ is shown as Sample in Tables 1 and 2 and the treating conditions (calcining temperature, Firing temp., and temperature of an insulating oil and direct voltage during polarization) are shown. The Q$_{max}$ varies depending on the shape of the ceramic, a vibration mode, and the type of the electrode, and Samples having a Q$_{max}$ of at least 15 under the above conditions are in practical use.

Since each of Samples of the example according to the present invention has a Q$_{max}$ of at least 15 as shown in Tables 1 and 2, it is clear that Samples are adapted to electric ceramics used for piezoelectric ceramic elements such as piezoelectric ceramic resonators in particular. Thus, the present invention provides a piezoelectric ceramic containing no lead or a small amount of lead and having a Q$_{max}$ of a practical level.

In the example according to the present invention, each sample fired at a temperature lower than another temperature at which $CaBi_4Ti_4O_{15}$ is formed has a large $Q_{max}$. Thus, the calcining temperature can be decreased, and this is an additional advantage of the present invention. The decrease in the calcining temperature saves energy such as electric power used during firing and elongates the life of the shell container housing the piezoelectric ceramic during firing.

The composition of the piezoelectric ceramic according to the present invention is not limited to the above example and the $Q_{max}$ is at least 15 as long as the following conditions are satisfied: $0.15 \leq a/c < 0.25$ and $3.5 \leq (2a+3b)/c \leq 3.88$.

In the above example, the $Q_{max}$ obtained by measuring the secondary high frequency in a thickness longitudinal vibration mode is described in the above example. The effect of the present invention is not limited to the secondary high frequency in a thickness longitudinal vibration mode, and the same effect in the secondary high frequency in a thickness longitudinal vibration mode is obtained in a fundamental wave in another vibration mode such as a thickness shear vibration mode or a thickness longitudinal vibration mode utilized by a piezoelectric ceramic element such as a piezoelectric ceramic resonator.

In Jpn. J. Appl. Pys., Vol. 34, Part 1, 9B, pp5096–5099, T. Atsuki et al report that a bismuth layer compound having formula $SrBi_2Ta_2O_9$ is used for a thin-film of a ferroelectric memory and the value of remanent polarization is increased when the compound is reformed so as to have formula $Sr_{0.7}B_{2.4}Ta_2O_9$. The present invention focuses on other compositions different from the above compound. The object of the present invention is to provide a piezoelectric ceramic used for piezoelectric ceramic elements, the application field is different from that of the above report, and required properties for materials for piezoelectric ceramic elements are different from that of materials for ferroelectric memories; hence, the present invention is not inferred from the studies conducted by Atsugi et al.

INDUSTRIAL APPLICABILITY

The piezoelectric ceramic of the present invention is used for various piezoelectric ceramic elements and is preferably used for piezoelectric ceramic resonators in particular.

What is claimed is:

1. A piezoelectric ceramic comprising a bismuth layer compound containing Ca, Bi, Ti and O, wherein the bismuth layer compound is the main component of the piezoelectric ceramic, the molar ratio of Ca to Bi to Ti in the bismuth layer compound is represented by a:b:c, and formulas $0.15 \leq a/c < 0.25$ and $3.5 \leq (2a+3b)/c \leq 3.88$ are satisfied.

2. The piezoelectric ceramic according to claim 1, further comprising a bivalent metal element other than Ca or a trivalent metal element other than Bi, wherein the molar ratio of the bivalent or trivalent metal element to Ti in the main component is 0.1:1 or less.

3. The piezoelectric ceramic according to claim 2, wherein said bivalent metal element is at least one selected from the group consisting of Mg, Sr, Ba and Pb.

4. The piezoelectric ceramic according to claim 3, further comprising Zr, wherein the molar ratio of Zr to Ti in the main component is less than 0.25:1.

5. The piezoelectric ceramic according to claim 3, further comprising Mn in an amount of 1.5% or less by weight on a $MnCO_3$ basis.

6. The piezoelectric ceramic according to claim 2, wherein said trivalent metal element is at least one selected from the group consisting of Sc, Y, La, Ce, Pr, Nd, Sm, Gd, Dy, Er and Yb.

7. The piezoelectric ceramic according to claim 6, further comprising Zr, wherein the molar ratio of Zr to Ti in the main component is less than 0.25:1.

8. The piezoelectric ceramic according to claim 6, further comprising Mn in an amount of 1.5% or less by weight on a $MnCO_3$ basis.

9. A piezoelectric ceramic comprising a bismuth layer compound containing Ca, Bi, Ti and O, wherein the bismuth layer compound is the main component of the piezoelectric ceramic, the molar ratio of Ca to Bi to Ti in the bismuth layer compound is represented by a:b:c, and formulas $0.15 \leq a/c < 0.25$ and $3.5 \leq (2a+3b)/c \leq 3.88$ are satisfied, and further comprising Zr, wherein the molar ratio of Zr to Ti in the main component is less than 0.25:1.

10. A piezoelectric ceramic comprising a bismuth layer compound containing Ca, Bi, Ti and O, wherein the bismuth layer compound is the main component of the piezoelectric ceramic, the molar ratio of Ca to Bi to Ti in the bismuth layer compound is represented by a:b:c, and formulas $0.15 \leq a/c < 0.25$ and $3.5 \leq (2a+3b)/c \leq 3.88$ are satisfied and further comprising Mn in an amount of 1.5% or less by weight on a $MnCO_3$ basis.

11. The piezoelectric ceramic according to claim 1, further comprising Nd, Ba, Sr or La in a molar ratio to the Ti in the main component of up to 0.1:1.

12. The piezoelectric ceramic according to claim 11, further comprising Zr, wherein the molar ratio of Zr to Ti in the main component is less than 0.25:1.

13. The piezoelectric ceramic according to claim 11, further comprising Mn in an amount of 1.5% or less by weight on a $MnCO_3$ basis.

14. The piezoelectric ceramic according to claim 11 in combination with piezoelectric electrodes.

15. The piezoelectric ceramic according to claim 10 in combination with piezoelectric electrodes.

16. The piezoelectric ceramic according to claim 9 in combination with piezoelectric electrodes.

17. The piezoelectric ceramic according to claim 2 in combination with piezoelectric electrodes.

18. The piezoelectric ceramic according to claim 1 in combination with piezoelectric electrodes.

* * * * *